(12) United States Patent
Gao et al.

(10) Patent No.: US 9,099,974 B2
(45) Date of Patent: Aug. 4, 2015

(54) VOLUME REDIRECTION

(71) Applicant: VMware, Inc., Palo Alto, CA (US)

(72) Inventors: Wenhua Gao, Beijing (CN); Shuhua Wang, Beijing (CN); Peng Guo, Beijing (CN); An Min Gong, Beijing (CN); Jian Ken Song, Beijing (CN)

(73) Assignee: VMware, Inc., Palo Alto, CA (US)

( * ) Notice: Subject to any disclaimer, the term of this patent is extended or adjusted under 35 U.S.C. 154(b) by 111 days.

(21) Appl. No.: 14/137,517

(22) Filed: Dec. 20, 2013

(65) Prior Publication Data

US 2015/0180432 A1  Jun. 25, 2015

(51) Int. Cl.
*H03G 3/20* (2006.01)
(52) U.S. Cl.
CPC ...................................... *H03G 3/20* (2013.01)

(58) Field of Classification Search
None
See application file for complete search history.

(56) References Cited

U.S. PATENT DOCUMENTS

2004/0029764 A1* 2/2004 Weber et al. .................. 510/446
2015/0019964 A1* 1/2015 Campbell ..................... 715/716

* cited by examiner

*Primary Examiner* — Paul Huber (57) ABSTRACT

Exemplary systems and methods enable a user of a mobile device that is communicatively coupled to a remote device to adjust the audio output volume level of an application running on the remote device using audio volume adjustment inputs on the mobile device. The application produces an audio output signal that has an adjustable audio volume output level. The mobile device receives the audio output signal from the remote device. The mobile device detects an audio volume adjustment input. The mobile device redirects the audio volume adjustment to the remote device to control the audio output volume level of the application.

21 Claims, 5 Drawing Sheets

VOLUME REDIRECTION

FIELD OF THE INVENTION

The various embodiments described herein relate to configuring a mobile device to adjust the audio output level of an application running on a remote host device that is communicatively coupled to the mobile device using audio volume adjustment inputs on the mobile device.

BACKGROUND OF THE INVENTION

In the context of remote desktop technology and virtual desktop infrastructure (VDI), a mobile device, such as a cell phone or tablet computer, may be used to run a client interface to access one or more applications running on a remote host device that is communicatively coupled to the mobile device via a network. For example, a user of a mobile device may remotely control and receive audio output from a media player application that is running on a virtual machine on the remote host device. To adjust the audio output volume level of a remotely running application, touch screen inputs are used to access a software slider bar or other software-generated control mechanism within the client interface to the remote system. Currently, separate audio volume adjustment inputs on the mobile device, such as keys or buttons that primarily function to adjust audio output volume, only adjust the volume of the mobile device or an application running locally on the mobile device. These keys or buttons, however, do not adjust the audio output volume level of the remote application or system volume on the remote host device.

SUMMARY OF THE INVENTION

Exemplary systems and methods enable a user of a mobile device to use the audio volume adjustment inputs on the mobile device to adjust the level of audio output of an application running on a remote device. A virtual desktop client on the mobile device provides a user interface to the remotely running application that allows the user to receive audio and video output from the application and to interact with and control the application. The virtual desktop client also monitors the audio volume adjustment inputs on the mobile device. When an audio volume adjustment input is detected on the mobile device, the virtual desktop client sends a message to a virtual desktop agent running on the remote device to adjust the audio output level of one or more applications running on the remote device. The virtual desktop agent causes the output volume of one or more applications running on the remote device to be adjusted according to the audio volume adjustment input on the mobile device. In effect, the audio volume adjustment inputs made on the mobile device are redirected to the application(s) on the remote device and adjust the audio output level of the application(s) on the remote device. In one embodiment, the remote desktop agent is executed on a virtual machine running on a remote host computer. In one embodiment, the audio output levels of all applications running on the remote device are adjusted in accordance with the audio volume adjustment inputs on the mobile device. In one embodiment, a setting within the virtual desktop client configures the mobile device to either direct the audio adjustment inputs to adjusting audio output levels of application(s) and hardware on the mobile device or to redirect the audio adjustment inputs to the remote device.

Other features and advantages will be apparent from the accompanying drawings and from the detailed description.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Embodiments described herein use audio volume adjustment inputs on a mobile device to adjust the level of audio output received by a mobile device from an application running on a remote device. For example, the mobile device may receive an audio volume adjustment input via a volume button or key and, in response, transmits a message to the remote device to increase or decrease the volume on the remote device. The mobile device then receives audio output from the application on the remote device with the audio output level of the application adjusted according to the audio volume adjustment inputs on the mobile device. As a result, an audio volume adjustment input that was previously limited to adjusting volume locally on the mobile device is redirected to adjust volume of an application running on the remote device.

Throughout the disclosure, physical hardware includes a desktop computer, laptop computer, tablet computer, personal digital assistant, cell phone, a server, etc. Virtual computing elements include a virtual machine and a virtualization software layer, or hypervisor, running on a host computer. A virtualization software layer may run directly on a host computer, known as a "bare metal" hypervisor, or may run on a guest operating system, known as a "hosted" hypervisor. Virtual computing elements further include virtual network interface cards (vNICs), virtual switches running within a virtualization software layer, and other virtual networking elements.

The term "audio volume adjustment input," as used herein, refers to activation, actuation, detection, or operation of an audio volume adjustment key. An audio volume adjustment key may include any one or more of a key, switch, button, knob, wheel, or other hardware input mechanism on the mobile device or on a peripheral device for the mobile device (e.g., wired or wireless headphones, keyboard, remote control, etc.). Audio volume adjustment keys may be provided in pairs, such as an increase ("+") key and a decrease ("−") key. Audio volume adjustment input may further include an aggregated plurality of audio volume adjustment key activations, such as one or more key presses of a volume increase key and/or volume decrease key.

Figure 1:
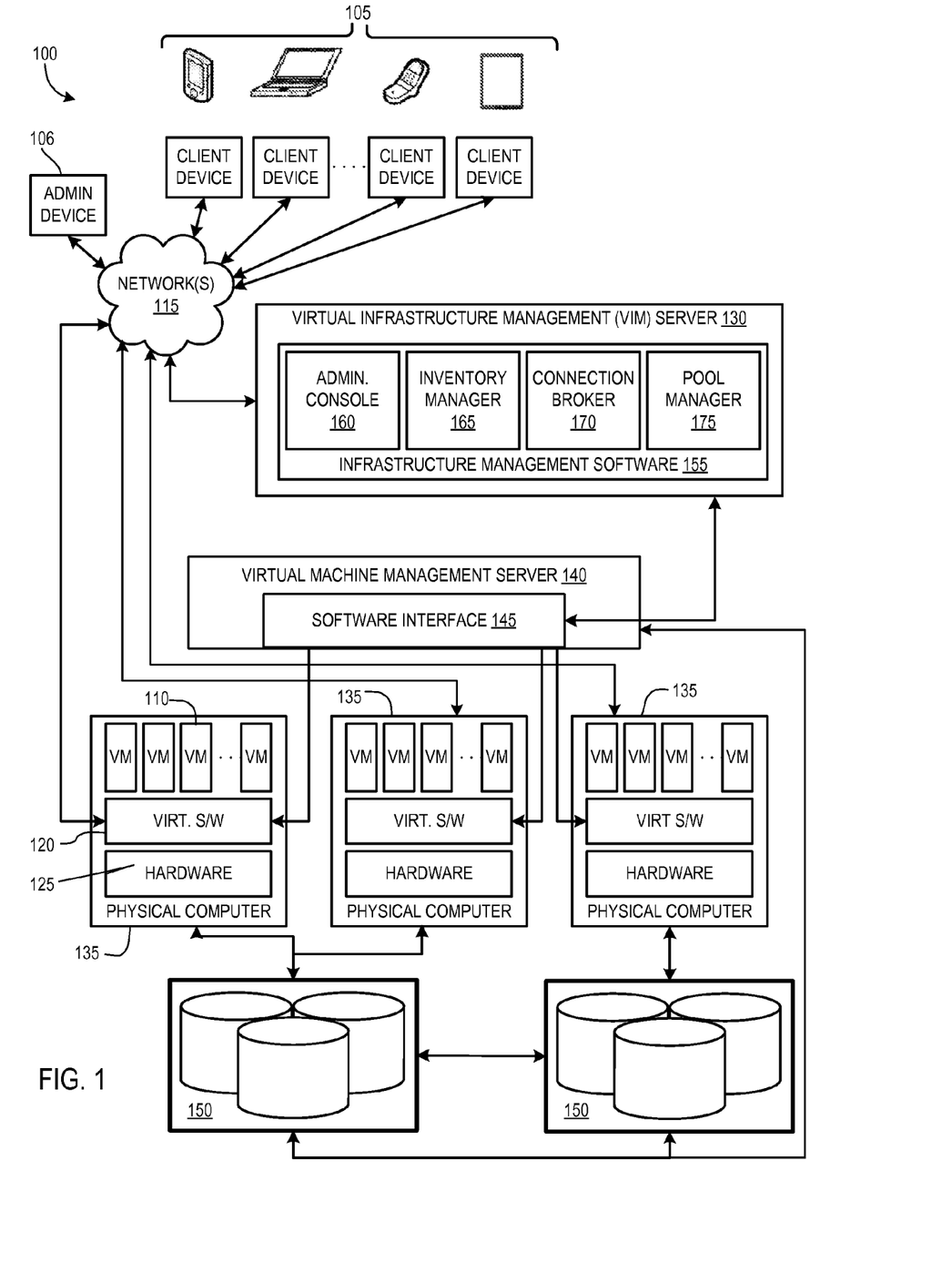
FIG. 1 illustrates, in block diagram form, an exemplary virtual computing infrastructure environment including a client device that adjusts the audio output level of audio output of an application running on a remote device.

FIG. 1 illustrates, in block diagram form, exemplary virtual computing infrastructure (VCI) 100 environment including one or more client devices 105 that may adjust the audio output level of audio output of an application running on a remote device, such as virtual machine (VM) 110 on host computing system 135. Each host processing system 135 includes hardware 125, virtualization software layer 120 (also referred to herein as a hypervisor), and one or more VMs 110. VCI 100 allows client devices 105 to access centrally-managed user virtual desktops, such as those implemented by VMs 110 running in a datacenter, via network(s) 115 (e.g., a local area network or other private or publically accessible wide area network, such as the Internet). For example, client device 105 and VM 110 use a desktop remoting protocol such as Remote Desktop Protocol (RDP), Virtual Network Computing (VNC), or Personal Computer over Internet Protocol (PCoIP) to remotely access/provide remote access to a virtual desktop generated by VM 110.

The term "desktop," as used herein, refers to a human interface environment through which users launch, interact with, and manage applications, settings, and/or data, etc. A virtual desktop is a virtual computing system that operates as a desktop or workstation computer with which an end user interacts using desktop remoting protocol and the software and/or hardware of client device 105. A virtualized desktop may export user interfaces, e.g., keyboard, touch screen, and mouse input, audio and visual output, to client device 105 from VM 110 running remotely (in the datacenter) or locally on client device 105, or, in some cases, using a hybrid. Client device 105 transmits user input, e.g., keyboard or mouse input, hardware keypresses such as volume adjustment inputs, and touch inputs, to VM 110 to be processed, and receives display and other data, such as sound and/or video, from VM 110 for presentation to a user of client device 105. Client device 105 presents a bitmap representation of the desktop generated by VM 110. Inputs to and outputs from the virtualized desktop are reflected in the bitmap representation on client device 105 as it occurs on the virtualized desktop within VM 110.

VMs 110 are complete computation environments, containing virtual equivalents of the hardware and system software components of a physical system. For example, these virtual equivalents appear as a complete physical machine to a guest operating system running within VM 110. VMs 110 are typically implemented by an extensive virtualization infrastructure, which includes a variety of software and hardware components. Virtualization software layer 120 (e.g., a hypervisor) running on hardware 125 of host computer 135 manages one or more VMs 110. In one embodiment, virtualization software layer 120 may run on a guest operating system (not shown). Virtualization software layer 120 manages physical resources, e.g., hardware 125, as well as maintains virtual-to-physical hardware mappings.

Virtual Infrastructure Management (VIM) server 130 includes administrative console 160, inventory manager 165, connection broker 170, pool manager 175 and infrastructure management software 155. Administrative console 160 provides a remotely accessible user interface to administrator device 106 to manage the configuration of VMs 110 within the VCI 100. In one embodiment, administrative console 160 exports a graphical user interface via hypertext transfer protocol (HTTP) to be accessed by a web browser. Alternatively, a command-line interface or a rich client is provided to administrator device 106, which includes a web browser to access the administrative console. Administrative console 160 allows administrator device 106 to perform a plurality of functions, such as: cloning VMs, creating desktop pools, associating desktop pools with VIM server 130, associating a desktop pool with a master image, defining VM state policies, and other similar operations.

Inventory manager 165 handles the events received from VMs 110. For example, when a user of a virtual desktop logs off or disconnects, a software agent running within a VM 110 sends a notification to inventory manager 165. Inventory manager 165 determines an effective policy that applies to the desktop and performs a maintenance operation, if required. Inventory manager 165 may also use timer-based events to schedule effective maintenance operations.

Correction broker 170 acts as a broker for client connections to virtual desktops. Connection broker 170 authenticates client requests using a directory service and directs the requests to the corresponding virtual desktops. Connection broker 170 allows a remote user or administrator, through a client 105 or administrator device 106, to select a type of virtual desktop and initiate a virtual desktop session or to access an existing connection to a virtual desktop. For example, as described below with reference to FIG. 2, client 105 includes virtual desktop client 107. In one embodiment, virtual desktop client 107 initiates a virtual desktop session with VM 110 via connection broker 170. In one embodiment, connection broker 170 connects to VM 110 to access or update policies associated with VM 110.

Pool manager 175 manages the lifecycle of virtual desktops. Virtual desktops in a pool are grouped together based on similar software requirements. Desktop Administrators create logical desktops groups (desktop pools) that are provisioned typically from the same base image. For example, a desktop pool may include cloned VMs 110 that run the same set of software applications and run the same operating system.

In general, virtual machine management server (VMM server) 140 provides software interface 145 to enable an administrator or other entity, such as inventory manager 165, connection broker 170, and pool manager 175, to access and manage VMs 110 as described above. Additionally, VMM server 140 supports operations for the discovery of compute, storage, and network resources; creation of logical compute pools by providing features such as automatic CPU and memory load balancing; provisioning/creation of one or more virtual disks, on local or shared storage-clones with full or sparse disks; creation of cloned VMs; and power operations on virtual machines (power on, power-off, suspend, resume, checkpoint, etc.).

While illustrated as separate components, in one embodiment, a single server or other networked processing device implements VIM server 130 and VMM server 140. For example, VIM server 130 and VMM server 140 may be implemented by one or more VMs 110.

Figure 2:
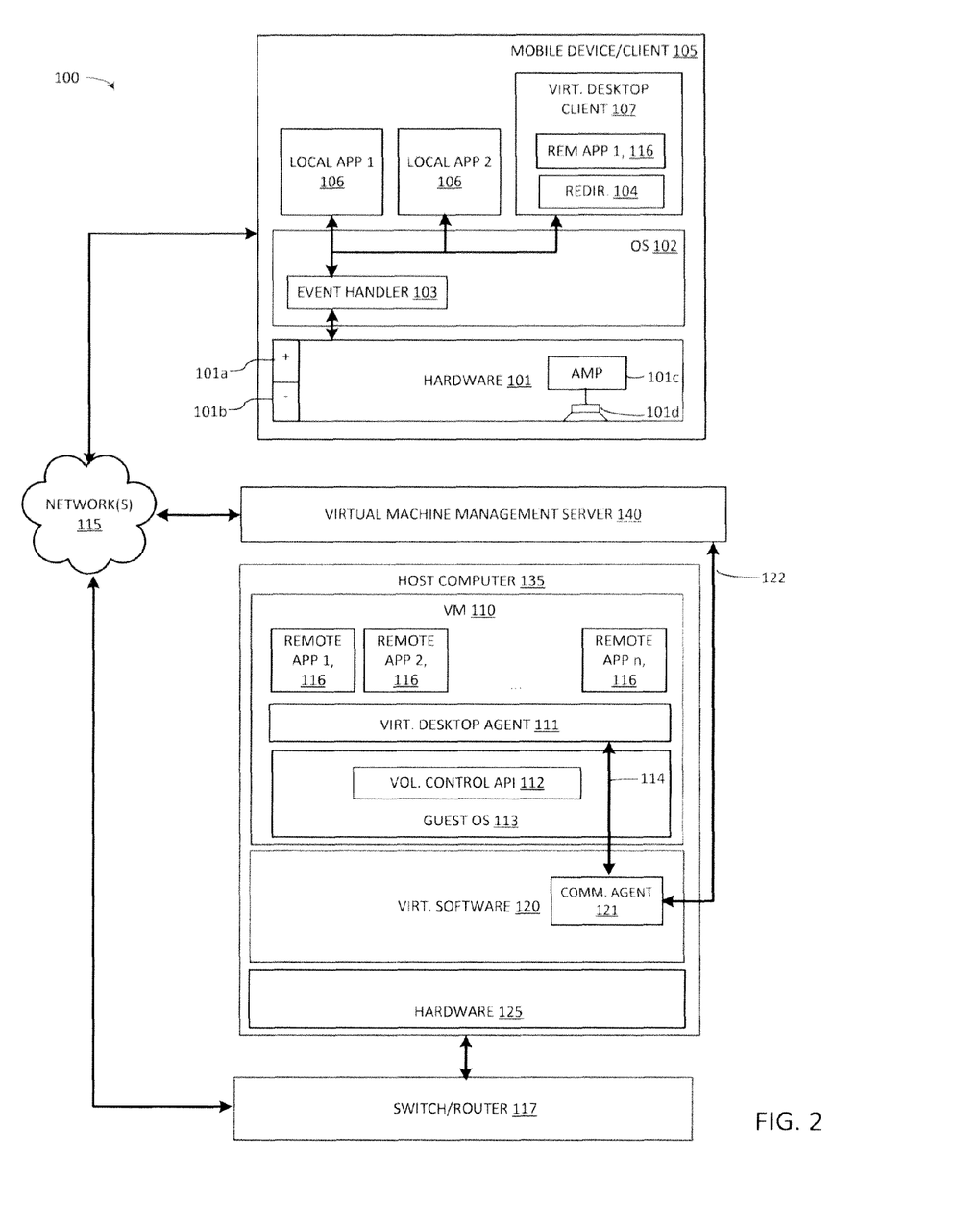
FIG. 2 illustrates, in block diagram form, a detailed view of client and a remote device within the exemplary virtual computing infrastructure environment of FIG. 1.

FIG. 2 illustrates a detailed view of mobile device client 105 and VM 110 running on host device 135 within the exemplary VCI 100 environment of FIG. 1. Client 105 and VM 110 communicate via switch/router 117 and network(s) 115, as described above with reference to FIG. 1. In one embodiment, client 105 and VM 110 communicate 122 via network(s) 115, VMM Server 140, and communication agent 121. Host 135 includes hardware 125, such as memory, (e.g. ROM, RAM, mass storage, etc.), microprocessor(s), display controller(s) and I/O devices and interfaces (e.g. touch input, volume adjustment control inputs, network interface, etc.) as described below with reference to FIG. 5. Host 135 further includes virtualization software layer 120. As described above, virtualization software layer 120 may run directly on a host 135 or on top of an operating system running within host 135.

Virtualization software layer 120 further includes communication agent 121. VM 110 includes virtual desktop agent 111. In one embodiment, virtual desktop agent 111 establishes secure, trusted communication channel 114 with communication agent 121 that provides virtual desktop agent 111 with direct access to virtualization software layer 120. For example, VM 110 does not need an IP address for virtualization software layer 120 or other management solution to transmit a message or credentials to log in or otherwise authenticate the transmission of the message. In one embodiment, secure communication channel 114 is implemented using shared memory. Virtual desktop agent 111 writes a message to the shared memory and communication agent 121 and virtualization software layer 120 reads the message from the shared memory. Alternatively, each virtual desktop agent 111 communicates with communication agent 121 by way of a virtual network interface. Virtual desktop agent 111 communicates with remote applications 116 on VM 110. In one embodiment, virtual desktop agent 111 communicates with the VM operating system or one or more applications through an application programming interface (API). For example, virtual desktop agent 111 may call the API in response to receipt of a message from virtual desktop client 107 on mobile device 105, as described in further detail herein. VMM server 140 is communicatively coupled 122 to communication agent 121 in virtualization software layer 120 of host 135.

Virtual desktop agent 111 receives volume adjustment message(s) from virtual desktop client 107 via communication agent 121, and communicates with one or more remote applications 116 running on VM 110. In one embodiment, VM 110 runs guest operating system 113. Guest operating system 113 includes volume control application programming interface (API) 112. Virtual desktop agent 111 makes calls to volume control API 112 to adjust audio properties in guest operating system 113 in response to one or more messages received by virtual desktop agent 111. For example, the following two Windows® API calls may be used to adjust volume properties within guest operating system 113, affecting a particular application having a handle, This.Handle:

SendMessage(This.Handle, WM_APPCOMMAND, 0x30292, APPCOMMAND_VOLUME_UP* 0x10000);
SendMessage(This.Handle, WM_APPCOMMAND, 0x30292, APPCOMMAND_VOLUME_DOWN* 0x10000);

In one embodiment, virtual desktop agent 111 receives and processes audio volume adjustment message(s) related to one or more remote applications 116 running on VM 110 independent of volume control API 112. In such an embodiment, virtual desktop agent 111 routes audio volume adjustment message(s) to the appropriate remote application(s) 116 and causes the remote application(s) to adjust their audio volume in accordance with the message(s).

Client 105 is a computing device such as a laptop computer, tablet computer, personal digital assistant, or cell phone, as described with reference to FIG. 5. Client 105 comprises hardware 101 and operating system (OS) 102, running one or more local applications 106. In one embodiment, virtual desktop client 107 is a local application 106 running on OS 102.

Virtual desktop client 107 provides an interface to a user of client 105 to interact with one or more remote applications 116 on VM 110. Using virtual desktop client 107, application 116 running on VM 110 appears to the user to be running on client 105. Virtual desktop client 107 receives screen updates, video, audio, system messages and other application information from an application on VM 110. VM 110 includes virtual desktop agent 111 that communicates with virtual desktop client 107 and with applications on VM 110. For example, virtual desktop client 107 receives user inputs to client 105 while providing the user with remote access to an application running on VM 110. Virtual desktop client 107 transmits one or more messages conveying the user inputs to virtual desktop agent 111. Virtual desktop agent 111 receives the message(s) from virtual desktop client 107 via network(s) 115, processes the messages, and passes the user inputs and other information within the messages to one or more applications on VM 110 (e.g., via API).

Hardware 101 includes audio volume adjustment keys 101a and 101b, configured to request an increase (+) or decrease (−) in audio volume perceived by a user of client 105. In one embodiment, audio volume adjustment keys 101a and 101b are implemented as a wheel or knob that is rotated in a first direction to increase audio volume and rotated in a second direction to decrease audio volume. Hardware 101 further includes amplifier 101c having an adjustable audio volume. Hardware 101 also includes output device 101d, e.g., a speaker, headphone jack, or wireless headset to provide audio output to a user of client 105.

In one embodiment, operating system 102 includes event handler 103 that communicates with hardware 101. Event handler 103 is also in communication with local application(s) 106 and virtual desktop client 107. Event handler 103 detects an audio volume adjustment input by detecting the pressing or actuating of audio volume adjustment keys 101a and/or 101b. In response to detecting the audio volume adjustment input, event handler 103 generates an audio volume adjustment event message characterizing the detected audio volume adjustment input. In one embodiment, if virtual desktop client 107 has the foreground focus of operating system 102, then the audio volume adjustment event message is sent to virtual desktop client 107.

Virtual desktop client 107 includes redirector 104. Redirector 104 receives a volume adjustment event message from event handler 103 and determines whether the volume adjustment event message should be redirected to remote application 116 or be processed locally by operating system 102 (e.g. adjusting system volume) or hardware 101 (e.g. adjusting hardware volume). In one embodiment, redirector 104 redirects the volume adjustment message to remote application 116 running on VM 110 when virtual desktop client 107 has the foreground focus of operating system 102 and remote application 116 has the focus of virtual desktop client 107. In another embodiment, a user of client 105 configures a setting on client 105 that determines whether audio volume adjustment input is processed locally (and thus is not redirected) regardless of whether virtual desktop 107 has the foreground focus of operating system 102. In yet another embodiment, a user of client 105 configures a setting on virtual desktop client 107 that determines whether an audio volume adjustment message is redirected to only the application that has the foreground focus of virtual desktop client 107, or whether the volume adjustment event message is redirected to all remote applications 116 running on VM 110 as viewed by virtual desktop client 107. In one embodiment, redirector 104 redirects the volume adjustment message to remote application 116 that is running in the background, e.g. minimized, on VM 110.

In one embodiment, application 116 running on VM 110 is, or includes, a media player that produces an audio output signal. Virtual desktop agent 111 transmits the audio output signal to virtual desktop client 107 (e.g., according to a desktop remoting protocol). Virtual desktop client 107 receives the audio output signal and utilizes hardware 101 of client 105 to convert the received audio output signal into sound. The volume of the sound produced in response to the audio output signal is controlled, at least in part, by the audio output volume level within the received audio output signal. In response to the audio output level, the user can make one or more audio volume adjustment inputs using client 105. For example, the user may press or otherwise activate an audio volume adjustment key, such as a volume button, key, knob, wheel, or other hardware input mechanism on the mobile device or on a peripheral device for the mobile device (e.g., wired or wireless headphones, keyboard, remote control, etc.). When mobile device 105 detects that the user has activated the audio volume adjustment key, client 105 can determine whether virtual desktop client 107 is being executed (e.g., "running" in the foreground) on client 105 at the time of activating the audio volume adjustment key. If virtual desktop client 107 is not running, the audio volume adjustment input can be directed to the local volume control component(s) of client 105 (as conventionally done) in order to control the local volume (e.g., volume of the speaker of the client 105). On the other hand, if virtual desktop client 107 is running on the client 105, virtual desktop client 107 can intercept the audio volume adjustment input and redirect the audio volume adjustment input, using redirector 104, in a message to virtual desktop agent 111 running on VM 110. In one embodiment, virtual desktop client 107 includes event handler 103 to detect the received audio volume adjustment input. In response to detecting the audio volume adjustment input event, redirector 104 passes the event to virtual desktop client 107 and virtual desktop client 107 transmits a message corresponding to the audio volume adjustment input to virtual desktop agent 111. In response to receiving the message, virtual desktop agent 111 causes one or more applications running on VM 110 to adjust the audio output volume level of the application(s). For example, virtual desktop agent 111 utilizes an API call to volume control API 112 to increase the application 116 or VM 110 system volume. The level of a subsequent audio output signal produced by application(s) and received by client 105 is adjusted according to the audio volume adjustment input made on client 105. Additionally, a visual representation of the increased volume, e.g., in the form of moving a volume control slider within a user interface, may be transmitted from virtual desktop agent 111 to virtual desktop client 107 to update a display of client 105. In one embodiment, the visual update is caused by a separate API call.

While the above implementation has been described with reference to the remote device being a virtual machine VM 110, in one embodiment, the remote device is a (non-virtual) computing device that runs one or more applications and virtual desktop agent 111. For example, remote desktop software including virtual desktop client 107 may be used to receive and control audio output signals from a remote computer running virtual desktop agent 111. Audio volume adjustment inputs made on client 105 are passed by virtual desktop client 107 to virtual desktop agent 111 on the remote device and adjust the audio output volume level of one or more applications 116, or a system volume level, on the remote device. An exemplary remote device is described with reference to FIG. 5.

Figure 3:
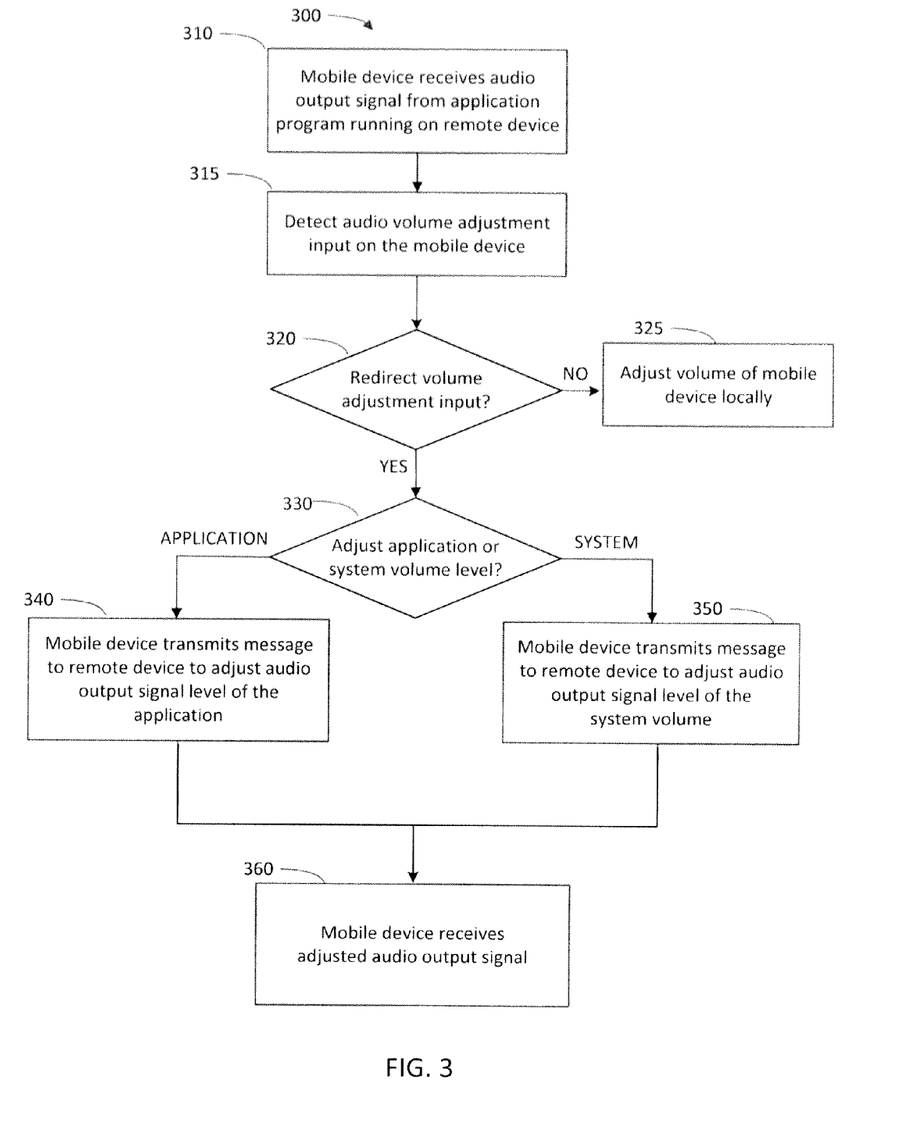
FIG. 3 is a flow diagram illustrating an exemplary method of a mobile device transmitting a message to a remote device to adjust the audio output volume level of an application running on the remote device in response to an audio volume adjustment inputs on the mobile device.

FIG. 3 is a flow diagram illustrating exemplary method 300 of a mobile device 105 transmitting a message to a remote device, such as VM 110, to adjust the audio output volume level of application 116 running on the remote device in response to an audio volume control input on the mobile device 105. In operation 310, as described above, mobile device 105 receives audio output from application 116 running on VM 110. Exemplary applications 116 include a media player, which may be a stand-alone media player application or a media player embedded within another application (e.g., a media player embedded within a web browser).

In operation 315, mobile device 105 detects an audio volume adjustment input. As described above, exemplary audio volume adjustment inputs include pressing an audio adjustment key, e.g. 101a or 101b, or other hardware input mechanism to increase or decrease volume. For example, the audio adjustment key may be dedicated, at least in the context of virtual desktop client 107, to the functionality of adjusting volume. In one embodiment, audio volume adjustment input further includes pressing a touch sensitive keypad configured as an audio volume adjustment key.

In one embodiment, the audio volume adjustment input results in a message or other signal within the operating system of mobile device 105. Detection of the audio volume adjustment input includes an event listener detecting the message or signal representing the keypress or other hardware input.

In operation 320, mobile device 105 determines whether the detected volume adjustment input should be applied locally, to the mobile device 105 system volume or hardware, such as an internal amplifier, or to redirect the detected volume adjustment input to the remote device. In one embodiment, mobile device 105 determines whether to redirect the detected volume adjustment input by detecting whether virtual desktop client 107 is running on mobile device 105. In another embodiment, virtual desktop client 107 makes this determination by inspecting a configuration setting that indicates whether the volume adjustment input should be redirected to VM 110.

If the volume adjustment input is to be applied locally, then in operation 425 the volume level of the mobile device is adjusted according to conventional means, including adjusting a hardware amplifier of the mobile device 105 or adjusting a system volume of operating system 102 on mobile device 105.

If the volume adjustment input is to be redirected to VM 110, then in operation 330, mobile device 105 optionally determines whether the detected volume adjustment input should be applied only to application 116 generating the audio output signal or applied to system volume within VM 110 (e.g., the volume of all applications 116 on VM 110 that are accessible by mobile device 105). In one embodiment, the determination is implemented by virtual desktop client 107 inspecting a configuration setting that indicates whether the volume adjustment input should be applied to one application or to all applications or the system volume of VM 110.

In one embodiment, by default, the audio volume adjustment input is applied to the application generating the output audio signal. In another embodiment, the volume adjustment input is applied, by default, to the system volume/all applications on VM 110. In yet another embodiment, the determination of whether to apply the volume adjustment input to a single application or the system volume is left to the remote device or applied to one or the other by default by the remote device.

If it has been determined in optional operation 330, or alternatively by default, that only the volume level of the application 116 is to be adjusted, then in operation 340, virtual desktop client 107 sends a message to virtual desktop agent 111 to adjust the audio output level of the application according to the volume adjustment inputs on mobile device

105. If it has been determined in optional operation 330, or alternatively by default, that the system volume/volume levels of all applications on VM 110 are to be adjusted, then in operation 350, virtual desktop client 107 sends a message to virtual desktop agent 111 to adjust the audio output level of the system/all applications according to the volume adjustment inputs on mobile device 105. In an alternate embodiment, virtual desktop client 107 sends a message to virtual desktop agent 111 to adjust the audio output level without regard to whether the volume is to be adjusted for a single application or the system.

Figure 4:
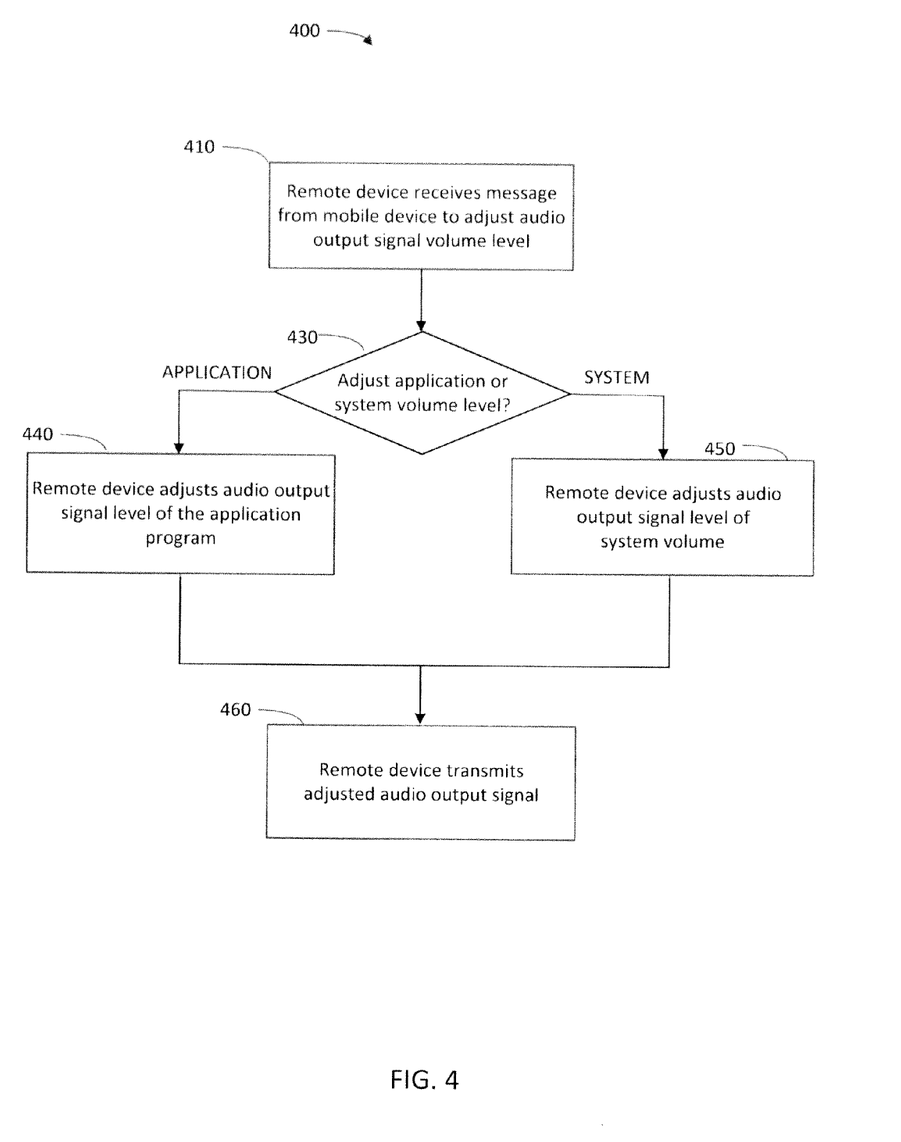
FIG. 4 is a flow diagram illustrating an exemplary method of a remote device responding to a message from a mobile device to adjust the audio output volume level of an application running on the remote device using audio volume adjustment inputs on the mobile device.

FIG. 4 is a flow diagram illustrating exemplary method 400 of VM 110 responding to a message from mobile device 105 to adjust the audio output volume level of an application 116 running on VM 110. In operation 410, VM 110 receives a message from mobile device 105 to adjust the audio output volume level of one or more applications 116 running on VM 110, according to volume level adjustment received by mobile device 105.

In operation 430, VM 110 optionally determines whether the volume adjustment input information in the message should be applied to the application 116 generating audio output that is being received by mobile device 105, or applied to the system volume/all applications on VM 110 that are accessible by mobile device 105. In one embodiment, the determination is implemented by virtual desktop agent 111 inspecting a configuration setting that indicates whether the volume adjustment input should be applied to one application or to the system volume/all applications on VM 110. Alternatively, the message from virtual desktop client 107 includes an indication as to whether the volume adjustment input should be applied to one application or to the system volume/all applications on VM 110.

In one embodiment, by default, the audio volume adjustment input is applied to the application generating the output audio being received by mobile device 105. In another embodiment, the volume adjustment input is applied, by default, to system volume/all applications on VM 110.

If it has been determined in optional operation 430, or alternatively by default, that only the volume level of the application is to be adjusted, then in operation 440 virtual desktop agent 111 causes the audio output level of the application to be adjusted according to the volume level adjustment information in the message received from mobile device 105 (e.g., as described above).

If it has been determined in optional operation 430, or alternatively by default, that the system volume/volume levels of all applications on VM 110 are to be adjusted, then in operation 450 virtual desktop agent 111 causes the audio output level of all applications on VM 110 to be adjusted according to the volume level adjustment information in the message received from mobile device 105 (e.g., as described above).

Figure 5:
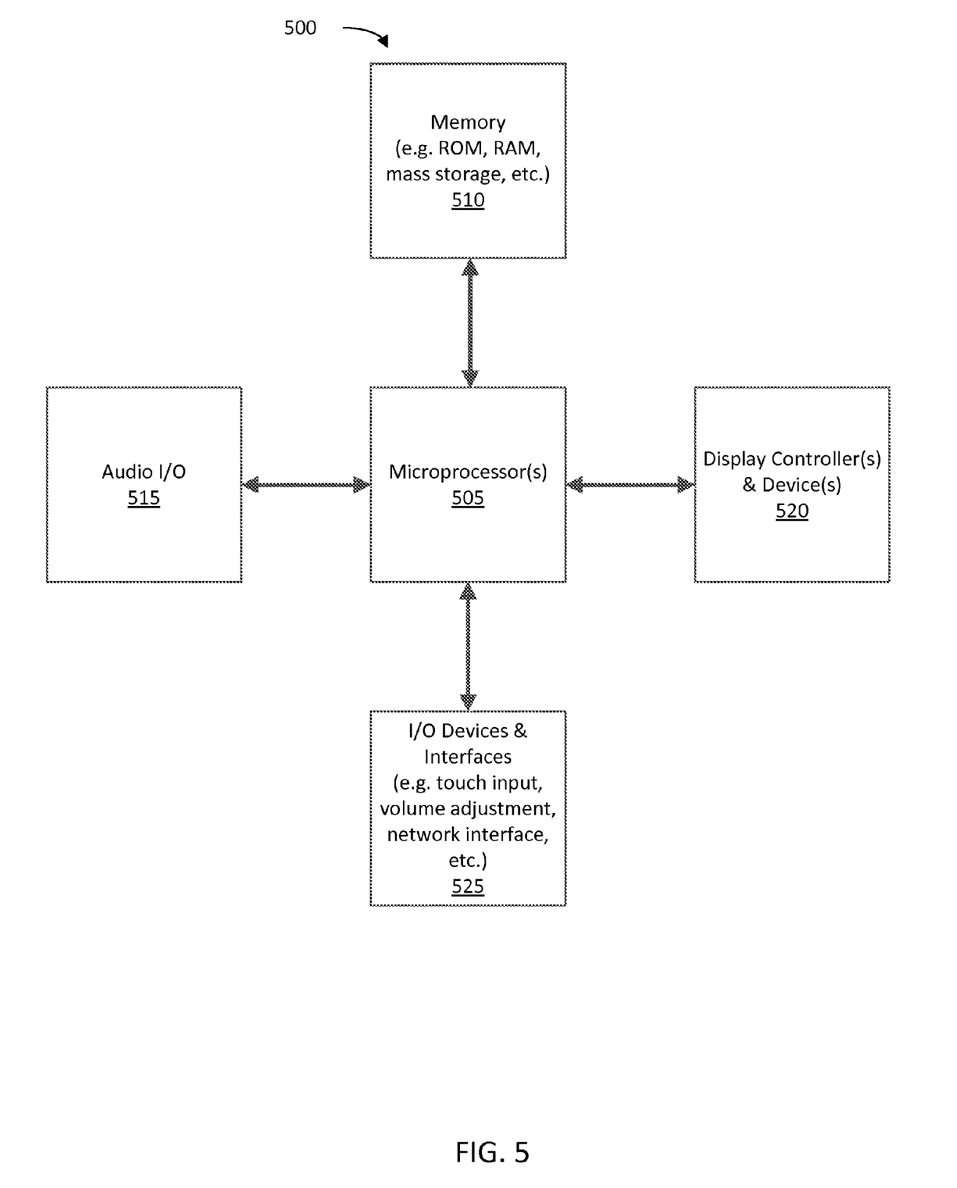
FIG. 5 illustrates, in block diagram form, an exemplary processing system to adjust the audio output volume level of an application running on the remote device using audio volume controls on the mobile device.

FIG. 5 illustrates, in block diagram form, exemplary processing system 500. Processing system 500 is an exemplary representation of one or more of client devices 105, remote device 110, administrative device 160, host computer 135, management server 165, and administrative console 180. Processing system 500 includes memory 510, which is coupled to microprocessor(s) 505. Memory 510 may be used for storing data, databases, metadata, and programs for execution by the microprocessor(s) 505. Memory 510 may include one or more of volatile and non-volatile memories, such as Random Access Memory ("RAM"), Read Only Memory ("ROM"), a solid state disk ("SSD"), Flash, Phase Change Memory ("PCM"), or other types of data storage. Memory 510 may be internal or distributed memory.

Processing system 500 also includes one or more input or output ("I/O") devices and interfaces 525 which are provided to allow a user to provide input to, receive output from, and otherwise transfer data to and from the system. I/O devices 525 may include a mouse, keypad or a keyboard, volume adjustment inputs such as a volume "+" and "−" keys, a volume adjustment rotary wheel or knob, and other inputs such as a touch panel or a multi-touch input panel, camera, optical scanner, network interface, modem, other known I/O devices or a combination of such I/O devices. I/O devices and interfaces 525 may also include a port, connector for a dock, or a connector for a USB interface, FireWire, Thunderbolt, Ethernet, Fibre Channel, etc. to connect the processing system 500 with another device, external component, or a network. Exemplary I/O devices and interfaces 525 also include wireless transceivers, such as an IEEE 802.11 transceiver, an infrared transceiver, a Bluetooth transceiver, a wireless cellular telephony transceiver (e.g., 2G, 3G, 4G, etc.), or another wireless protocol to connect processing system 500 with another device, external component, or a network and receive stored instructions, data, tokens, etc. It will be appreciated that one or more buses, may be used to interconnect the various components described above.

Processing system 500 also includes audio input/output subsystem 515 which may include a microphone and/or a speaker for, for example, playing back music or other audio, receiving voice instructions to be executed by microprocessor(s) 505, playing audio notifications, etc. Display controller and display device 520 provides a visual user interface for the user.

Processing system 500 may be a personal computer, tablet-style device, a personal digital assistant (PDA), a cellular telephone with PDA-like functionality, a Wi-Fi based telephone, a handheld computer which includes a cellular telephone, a media player, an entertainment system, or devices which combine aspects or functions of these devices, such as a media player combined with a PDA and a cellular telephone in one device. In other embodiments, processing system 500 may be a network computer, server, or an embedded processing device within another device or consumer electronic product. As used herein, the terms computer, device, system, processing system, processing device, and "apparatus comprising a processing device" may be used interchangeably with processing system 500 and include the above-listed exemplary embodiments.

It will be appreciated that additional components, not shown, may also be part of processing system 500, and, in certain embodiments, fewer components may also be used in processing system 500. It will be apparent from this description that aspects of the inventions may be embodied, at least in part, in software. That is, the computer-implemented methods of FIG. 3 and FIG. 4 may be carried out in a processing system 500 in response to its processor(s) or processing system executing sequences of instructions contained in a memory or other non-transitory machine-readable storage medium. The software may further be transmitted or received over a network (not shown) via network interface device 525. In various embodiments, hardwired circuitry may be used in combination with the software instructions to implement the present embodiments. Thus, the techniques are not limited to any specific combination of hardware circuitry and software, or to any particular source for the instructions executed by processing system 500.

The instructions executed by the processing system may be embodied in a non-transitory computer-readable medium including an article of manufacture. An article of manufacture that stores program code may be embodied as, but is not limited to, one or more memories (e.g., one or more flash memories, random access memories—static, dynamic, or other), optical disks, CD-ROMs, DVD-ROMs, EPROMs, EEPROMs, magnetic or optical cards or other type of non-transitory machine-readable media suitable for storing electronic instructions. Additionally, embodiments of the invention may be implemented in, but not limited to, hardware or firmware utilizing an FPGA, ASIC, a processor, a computer, or a computer system including a network. Modules and components of hardware or software implementations can be divided or combined without significantly altering embodiments of the invention.

In the foregoing specification, the invention has been described with reference to specific exemplary embodiments thereof. Various embodiments and aspects of the invention(s) are described with reference to details discussed herein, and the accompanying drawings illustrate the various embodiments. The description above and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

It will be evident that various modifications may be made thereto without departing from the broader spirit and scope of the invention as set forth in the following claims. For example, the methods described herein may be performed with fewer or more features/blocks or the features/blocks may be performed in differing orders. Additionally, the methods described herein may be repeated or performed in parallel with one another or in parallel with different instances of the same or similar methods.

What is claimed is:

1. A computer-implemented method comprising:
    receiving, by a mobile device, an audio output signal from an application running on a remote device that is communicatively coupled to the mobile device, the audio output signal having an adjustable audio output volume level;
    detecting an audio volume adjustment input on the mobile device resulting from a pressing of an audio volume adjustment key, the audio volume adjustment key operable to control a volume level of the mobile device;
    determining that the mobile device is executing a virtual desktop client at the time of detecting the audio volume adjustment input, the virtual desktop client providing a remote interface to the remote device;
    redirecting the audio volume adjustment input from controlling the volume level on the mobile device to control a volume level of the application running on the remote device by transmitting, in response to the detected audio volume adjustment input, a message to a virtual desktop agent on the remote device to adjust the audio output volume level of the audio output signal of the application according to the audio volume adjustment input on the mobile device; and
    receiving, by the mobile device, the audio output signal from the application running on the remote device, the audio output signal having been adjusted according to the audio volume adjustment input.

2. The method of claim 1, wherein the audio volume adjustment key is a physical component of the mobile device.

3. The method of claim 1, wherein the audio output signal is received along with the transmission of video output of a remote desktop running on a virtual machine, the virtual desktop agent is a software component of the virtual machine, and the virtual desktop agent is communicatively coupled to a plurality of applications running on the virtual machine.

4. The method of claim 3, wherein the virtual desktop agent, in response to the message, calls an application programming interface to adjust the volume of one or more of the plurality of applications running on the virtual machine.

5. The method of claim 1, wherein the virtual desktop agent adjusts the audio volume level of the audio output signal of the application in response to receiving the message.

6. The method of claim 1, wherein the virtual desktop agent adjusts the audio volume level of the audio output signal of a plurality of applications running on the remote device in response to receiving the message.

7. The method of claim 1, wherein the application is currently running in the foreground of a virtual desktop executing on the remote device.

8. The method of claim 1, wherein redirecting the audio volume adjustment input from controlling the volume level on the mobile device to control a volume level of the application running on the remote device is additionally in response to detecting a user-configurable setting that audio volume adjustment input redirection is enabled.

9. A non-transitory computer-readable medium programmed with executable instructions that, when executed by one or more processors, cause the one or more processors to execute a set of operations comprising:
    receiving, by a mobile device, an audio output signal from an application running on a remote device that is communicatively coupled to the mobile device, the audio output signal having an adjustable audio output volume level;
    detecting an audio volume adjustment input on the mobile device resulting from a pressing of an audio volume adjustment key, the audio volume adjustment key operable to control a volume level of the mobile device;
    determining that the mobile device is executing a virtual desktop client at the time of detecting the audio volume adjustment input, the virtual desktop client providing a remote interface to the remote device;
    redirecting the audio volume adjustment input from controlling the volume level on the mobile device to control a volume level on the application running on the remote device by transmitting, in response to the detected audio volume adjustment input, a message to a virtual desktop agent on the remote device to adjust the audio output volume level of the audio output signal of the application according to the audio volume adjustment input on the mobile device; and
    receiving, by the mobile device, the audio output signal from the application running on the remote device, the audio output signal having been adjusted according to the audio volume adjustment input.

10. The non-transitory computer-readable medium of claim 9, wherein the audio volume adjustment key is a physical component of the mobile device.

11. The non-transitory computer-readable medium of claim 9, wherein the audio output signal is received along with the transmission of video output of a remote desktop running on a virtual machine, the virtual desktop agent is a software component of the virtual machine, and the virtual desktop agent is communicatively coupled to a plurality of applications running on the virtual machine.

12. The non-transitory computer-readable medium of claim 11, wherein the virtual desktop agent, in response to the message, calls an application programming interface to adjust the volume of one or more of the plurality of applications running on the virtual machine.

13. The non-transitory computer-readable medium of claim 9, wherein the virtual desktop agent adjusts the audio volume level of the audio output signal of the application in response to receiving the message.

14. The non-transitory computer-readable medium of claim 9, wherein the virtual desktop agent adjusts the audio volume level of the audio output signal of a plurality of applications running on the remote device in response to receiving the message.

15. The non-transitory computer-readable medium of claim 9, wherein the application is currently running in the foreground of a virtual desktop executing on the remote device.

16. A system, comprising:
a processing device programmed with executable instructions that, when executed, perform a method comprising:
receiving, by a mobile device, an audio output signal from an application running on a remote device that is communicatively coupled to the mobile device, the audio output signal having an adjustable audio output volume level;
detecting an audio volume adjustment input on the mobile device resulting from a pressing of an audio volume adjustment key, the audio volume adjustment key operable to control a volume level of the mobile device;
determining that the mobile device is executing a virtual desktop client at the time of detecting the audio volume adjustment input, the virtual desktop client providing a remote interface to the remote device;
redirecting the audio volume adjustment input from controlling the volume level on the mobile device to control a volume level of the application running on the remote device by transmitting, in response to the detected audio volume adjustment input, a message to a virtual desktop agent on the remote device to adjust the audio output volume level of the audio output signal of the application according to the audio volume adjustment input on the mobile device; and
receiving, by the mobile device, the audio output signal from the application running on the remote device, the audio output signal having been adjusted according to the audio volume adjustment input.

17. The system of claim 16, wherein the audio volume adjustment key is a physical component of the mobile device.

18. The system of claim 16, wherein the audio output signal is received along with the transmission of video output of a remote desktop running on a virtual machine, the virtual desktop agent is a software component of the virtual machine, and the virtual desktop agent is communicatively coupled to a plurality of applications running on the virtual machine.

19. The system of claim 18, wherein the virtual desktop agent, in response to the message, calls an application programming interface to adjust the volume of one or more of the plurality of applications running on the virtual machine.

20. The system of claim 16, wherein the virtual desktop agent adjusts the audio volume level of the audio output signal of a plurality of applications running on the remote device in response to receiving the message.

21. The system of claim 16, wherein the application is currently running in the foreground of a virtual desktop executing on the remote device.

\* \* \* \* \*